United States Patent
Aiba et al.

(10) Patent No.: US 7,122,897 B2
(45) Date of Patent: Oct. 17, 2006

(54) SEMICONDUCTOR DEVICE AND METHOD OF MANUFACTURING THE SEMICONDUCTOR DEVICE

(75) Inventors: Yoshitaka Aiba, Kawasaki (JP); Ryuji Nomoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/945,111

(22) Filed: Sep. 21, 2004

(65) Prior Publication Data
US 2005/0253264 A1 Nov. 17, 2005

(30) Foreign Application Priority Data
May 12, 2004 (JP) .............................. 2004-142765

(51) Int. Cl.
*H01L 23/48* (2006.01)
*H01L 23/52* (2006.01)

(52) U.S. Cl. ............... 257/738; 257/737; 257/E23.021; 228/180.22

(58) Field of Classification Search ................ 257/737, 257/738, 780, 781, 180.22, E23.021, 615
See application file for complete search history.

(56) References Cited

U.S. PATENT DOCUMENTS 5,821,626 A * 10/1998 Ouchi et al. ................ 257/778
6,159,837 A * 12/2000 Yamaji et al. ............... 438/613
6,380,061 B1 * 4/2002 Kobayashi et al. .......... 438/613

FOREIGN PATENT DOCUMENTS

| JP | 2001-291733 | 10/2001 |
| JP | 2002-270721 | 9/2002 |
| KR | 1999-024546 | 4/1999 |

OTHER PUBLICATIONS

Office Action from Korean Patent Office dated Mar. 24, 2006, in corresponding Korean patent application.

* cited by examiner

*Primary Examiner*—Jasmine Clark
(74) *Attorney, Agent, or Firm*—Westerman, Hattori, Daniels & Adrian, LLP.

(57) ABSTRACT

A semiconductor device comprises a semiconductor chip, a wiring layer formed on the semiconductor chip, a column electrode connected at a first end to the wiring layer, and an encapsulation resin formed on the semiconductor chip. In the semiconductor device, the column electrode is provided with a second end, opposite to the first end, projecting from the encapsulation resin, and an external connection member is connected to the column electrode at the second end so that the external connection member is separate from a surface of the encapsulation resin.

10 Claims, 15 Drawing Sheets

SEMICONDUCTOR DEVICE AND METHOD OF MANUFACTURING THE SEMICONDUCTOR DEVICE

CROSS-REFERENCE TO RELATED APPLICATIONS

This application is based upon and claims the benefit of priority from Japanese Patent Application No. 2004-142765, filed on May 12, 2004, the entire contents of which are herein incorporated by reference.

BACKGROUND OF THE INVENTION

1. Field of the Invention

The present invention generally relates to a semiconductor device and method of manufacture thereof, and more particularly to a semiconductor device and method of manufacture thereof, which includes a column electrode having one end connected to a wiring layer on a semiconductor chip and having the other end connected to an external connection terminal.

2. Description of the Related Art

In recent years, the CSP (chip size package) has come to be increasingly used as a semiconductor device mounted on a small-sized electronic device represented by a portable digital electronic device, such as a cellular phone.

Miniaturization and high density can be attained with the CSP type semiconductor device. However, in recent years, the pitch between the external connection terminals is in the tendency that it becomes narrower with the demand for further miniaturization of the semiconductor device.

Thus, since the bonding area of the electrode formed in the mounting substrate and the external connection terminal of the semiconductor device becomes small as the external connection terminal pitch becomes narrow, the mounting reliability of the semiconductor device on the mounting substrate will decline.

In order to avoid the problem, a semiconductor device in which the column electrode is formed between the semiconductor chip and the external connection terminal is devised (for example, see Japanese Laid-Open Patent Application No. 2002-270721 and Japanese Laid-Open Patent Application No. 2001-291733).

It is known that, in the semiconductor device having the column electrode, the stress present in the column electrode and the surrounding resin layer at the time of mounting can be relaxed or absorbed, and the mounting reliability is excellent when compared with the semiconductor device having no column electrode.

FIG. 1 and FIG. 2 show examples of the conventional semiconductor device having the column electrode.

The semiconductor device 1A shown in FIG. 1 includes the insulating film 3, such as polyimide, which is formed on the circuit formation surface of the semiconductor chip 2A, and the wiring layer 4 (re-wiring layer) which is formed on the insulating film 3.

The wiring layer 4 is electrically connected with the semiconductor chip 2A through the hole formed in the insulating film 3. The column electrode 5 is formed in the state where it is set on the wiring layer 4.

The column electrode 5 has the cylindrical configuration. In the composition of FIG. 1, the upper end of the column electrode 5 is bonded to the wiring layer 4, and the solder ball 7 which serves as the external connection terminal is arranged at the lower end through the barrier metal 6 (for example, Ni and Au plating).

Moreover, the encapsulation resin 8 is formed on the bottom of the semiconductor chip 2A. The encapsulation resin 8 functions to protect the wiring layer 4 and the column electrode 5, and is formed, in the composition of FIG. 1, to have a thickness that is large enough to encapsulate the whole column electrode 5 except for the lower end where the barrier metal 6 is formed.

For this reason, in the structure of the conventional semiconductor device 1A, the end of the column electrode 5 where the barrier metal 6 is formed is flush with the surface of the encapsulation resin 8, and it is the structure in which the solder ball 7 and the encapsulation resin 8 are not separate from each other.

On the other hand, the semiconductor device 1B shown in FIG. 2 is the semiconductor device which receives or outputs the high frequency signal.

In FIG. 2, the elements that are essentially the same as corresponding elements in FIG. 1 are designated by the same reference numerals and a description thereof will be omitted.

Moreover, shown in FIG. 2 is the condition in which the semiconductor device 1B is mounted on the mounting substrate 10, and, the column electrodes 5 and 5A are bonded to the connection electrodes 11 and 11A of the mounting substrate 10 through the solder balls 7.

As mentioned above, the semiconductor device 1B is provided for the high-frequency signal transmission, and the column electrode 5A and the connection electrode 11A with which the high-frequency signal is exchanged are smaller in size than the column electrode 5 and the connection electrode 11 for the parasitic-capacitance reduction between the semiconductor chip 2B and the wiring layer 4 (re-wiring). In FIG. 2, reference numeral 9 indicates the passivation film.

In the semiconductor devices 1A and 1B of FIG. 1 and FIG. 2, the stress present at the time of mounting can be relaxed or absorbed by the column electrodes 5 and 5A and the surrounding encapsulation resin 8, and the improvement in the mounting reliability can be aimed at.

However, in this connection, if the further miniaturization and high density of the semiconductor devices 1A and 1B progress and the adoption of smaller pitch of the solder balls 7 (external connection terminals) progresses further, the decline of the mounting reliability will be produced similarly even with the semiconductor devices 1A and 1B using the column electrodes 5 and 5A.

Moreover, the problem arises in that the reduction of the distance of the adjoining column electrodes 5 and 5A by the adoption of smaller pitch will easily cause the occurrence of the short circuiting (bridging) between the adjoining solder balls 7 at the time of arranging the solder balls 7 in the column electrodes 5 and 5A and at the time of bonding the column electrodes 5 and 5A to the connection electrodes 11 and 11A of the mounting substrate 10.

Especially when the solder is used as a material of the external connection terminal as shown in FIG. 1 and FIG. 2, in the composition in which the tips of the column electrodes 5 and 5A and the surface of the encapsulation resin 8 are almost flush with each other, the solvent component in the solder flows on the surface of the encapsulation resin 8 at the time of heating, and it is easily in contact with the adjacent column electrodes 5 and 5A. Since the solvent component have good wettability to the solder, the short circuiting of the adjoining column electrodes 5 and 5A with the solder balls 7 will be caused by the contact of the solvent component as a result.

Furthermore, in the composition in which the encapsulation resin 8 encapsulates the whole column electrodes 5 and 5A (except for the tips thereof), the thickness of the semiconductor devices 1A and 1B of FIG. 1 and FIG. 2 is comparatively large.

For this reason, there is the problem in that the difference of the thermal expansion occurs between the silicon of the semiconductor chips 2A and 2B and the encapsulation resin 8 having a coefficient of thermal expansion different from that of the silicon, and the occurrence of the curvature will be easily produced in the semiconductor devices 1A and 1B.

SUMMARY OF THE INVENTION

An object of the present invention is to provide an improved semiconductor device in which the above-mentioned problems are eliminated.

Another object of the present invention is to provide a semiconductor device in which the short circuiting of the adjoining external connection terminals can be inhibited and the occurrence of the curvature can be inhibited.

Another object of the present invention is to provide a method of manufacturing a semiconductor device in which the short circuiting of the adjoining external connection terminals can be inhibited and the occurrence of the curvature can be inhibited.

The above-mentioned objects of the present invention are achieved by a semiconductor device comprising: a semiconductor chip; a wiring layer formed on the semiconductor chip; a column electrode connected at a first end to the wiring layer; and an encapsulation resin formed on the semiconductor chip; wherein the column electrode is provided with a second end, opposite to the first end, projecting from the encapsulation resin, and an external connection member is connected to the column electrode at the second end so that the external connection member is separate from a surface of the encapsulation resin.

According to the semiconductor device of the present invention, the external connection terminal and the encapsulation resin surface is made separate from each other, and the short circuiting (bridging) of the adjoining external connection terminals at the time of formation of the external connection terminals and at the time of mounting of the semiconductor device can be prevented. Moreover, by making the external connection terminal and the encapsulation resin separate, the thickness of the encapsulation resin can be made small, and the amount of the curvature present in the semiconductor device can be reduced.

The above-mentioned semiconductor device may be provided so that a clearance between the encapsulation resin surface and the external connection member is above 10 micrometers and below 80 micrometers.

According to the present invention, the clearance between the encapsulation resin and the external connection member is set in a range of between 10 micrometers and 80 micrometers, and the prevention of the short circuiting of the adjoining external connection terminals and the prevention of the curvature present in the semiconductor device are effectively realizable.

The above-mentioned semiconductor device may be provided so that a barrier metal is provided between the column electrode and the external connection member.

According to the present invention, the junction reliability of the column electrode and the external connection member can be raised with the use of the barrier metal.

The above-mentioned semiconductor device may be provided so that a cross-sectional area of the column electrode in contact at the second end with the external connection member is larger than a cross-sectional area of the column electrode in contact at the first end with the wiring layer.

According to the present invention, the cross-sectional area of the column electrode in the portion where the column electrode and the wiring layer touch can be made small, and the improvement in the characteristics is realizable with the reduction of the parasitic capacitance between the column electrode and the semiconductor chip. Moreover, the cross-sectional area of the column electrode in the portion which the column electrode and the external connection member touch can be enlarged, and it is possible to raise the junction strength of the column electrode and the external connection member, and the decline of the mounting reliability can be prevented.

The above-mentioned semiconductor device may be provided so that the cross-sectional area of the column electrode increases continuously from at the first end to at the second end according to a distance from the wiring layer.

Moreover, the above-mentioned semiconductor device may be provided so that the cross-sectional area of the column electrode has a stepwise increase from at the first end to at the second end according to a distance from the wiring layer.

According to the present invention, the diameter of the column electrode in the portion where the column electrode and the wiring layer touch can be made small, and the improvement in the characteristics is realizable with the reduction of the parasitic capacitance between the column electrode and the semiconductor chip. Moreover, the diameter of the column electrode in the portion where the column electrode and the external connection member touch can be enlarged, and it is possible to raise the junction strength of the column electrode and the external connection member, and the decline of the mounting reliability can be prevented.

Moreover, the above-mentioned objects of the present invention are achieved by a method of manufacturing a semiconductor device, the method comprising the steps of: forming a wiring layer on a semiconductor substrate; forming a resist having an opening which is used for forming a column electrode on the wiring layer, and forming a conductive metal in the opening using the resist so that a thickness of the conductive metal exceeds a thickness of the resist; forming an encapsulation resin on the semiconductor substrate after the resist is removed; and performing processing to make a thickness of the formed encapsulation resin small.

According to the present invention, the end of the column electrode is separated from the surface of the encapsulation resin by performing the processing to make the thickness of the encapsulation resin small, and it is possible to simply and certainly separate the end of the column electrode from the encapsulation resin surface.

The above-mentioned manufacturing method may be provided so that the processing to make the thickness of the formed encapsulation resin small is performed by using etching.

According to the present invention, the thickness of the encapsulation resin is made small by performing the etching after the encapsulation resin is formed, and at the time of the etching, the unnecessary encapsulation resin adhering to the surface of the column electrode etc. can be removed completely, and, therefore, the improvement in the yield at the time of external terminal formation can be aimed at.

The above-mentioned manufacturing method may be provided to further comprise the step of forming, after the processing to make the thickness of the formed encapsulation resin small is performed, an external connection member at an end of the column electrode separate from a surface of the encapsulation resin.

According to the present invention, after the end of the column electrode is separated from the surface of the encapsulation resin by making the thickness of the encapsulation resin small, the external connection member is formed at the end of the column electrode. Even if the solvent component flows from the external connection member at the time of the formation of the external connection member, the solvent component is present to the end of the column electrode projecting from the surface of the encapsulation resin. The short circuiting of the adjoining external connection members due to the solvent component as in the conventional semiconductor device can be prevented.

The above-mentioned manufacturing method may be provided so that the encapsulation resin is formed using a transfer molding method.

According to the present invention, when the transfer molding method is used, the encapsulation of resin can be carried out regardless of the height of the column electrode. The coefficient of linear expansion or the like can be freely chosen because the size or amount of filler in the encapsulation resin can be freely changed.

According to the present invention, the short circuiting (bridging) of the adjoining external connection terminals at the time of formation of the external connection terminals and at the time of mounting of the semiconductor device can be prevented. Moreover, the encapsulation resin can be made thin by separating the external connection terminal and the encapsulation resin from each other, and the amount of the curvature present in the semiconductor device can be reduced.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 3:
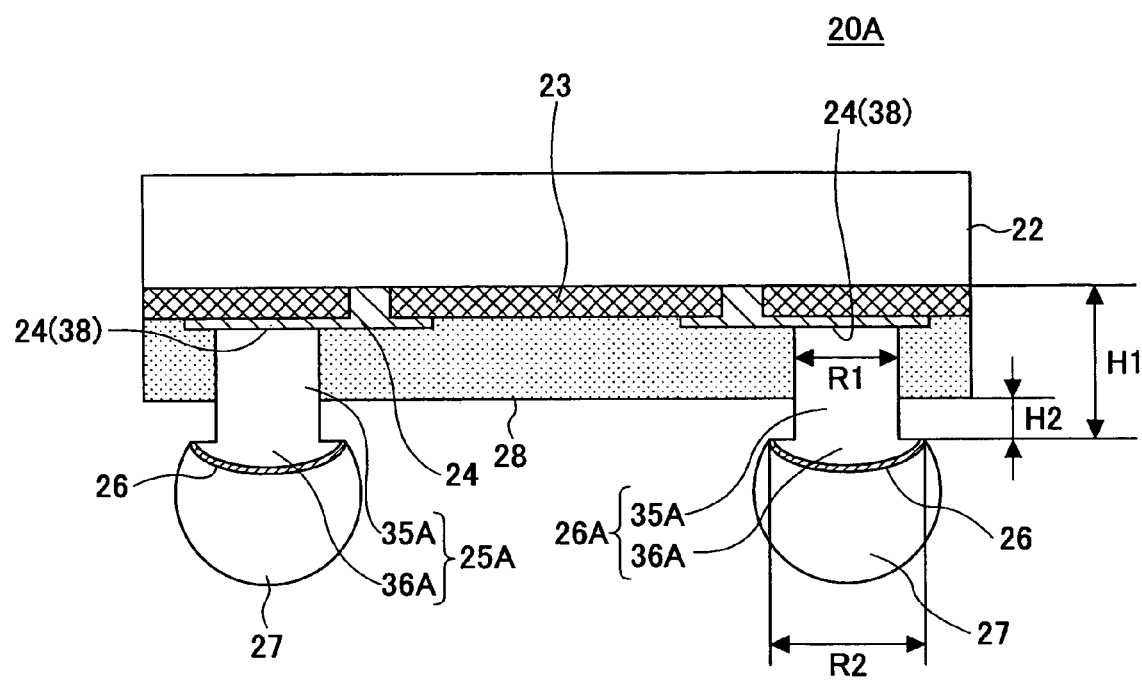
FIG. 3 is a cross-sectional diagram showing the composition of a semiconductor device in the first preferred embodiment of the invention.

FIG. 3 shows a semiconductor device 20A in the first preferred embodiment of the present invention.

The semiconductor device 20A is the CSP (chip size package) with which miniaturization and high density of the semiconductor device can be attained. For example, this semiconductor device 20A is mounted on a portable digital electronic device, such as a cellular phone.

The semiconductor device 20A generally comprises the semiconductor chip 22, the wiring layer 24, the column electrode 25A, the solder ball 27, and the encapsulation resin 28.

The semiconductor chip 22 is the silicon substrate on which an electronic circuit is formed, and the undersurface of the semiconductor chip 22 in FIG. 3 is the circuit-formation surface.

The insulating film 23 is formed on the circuit-formation surface of the semiconductor chip 22. For example, as a material of the insulating film 23, polyimide can be used.

The wiring layer 24 is formed on the insulating film 23. The wiring layer 24 functions as the so-called re-wiring layer, and the end of the wiring layer 24 is connected to the electrode part (not shown) of the semiconductor chip 22 through the hole formed in the insulating film 23.

Moreover, the other end of the wiring layer 24 is extended to the predetermined position where the electrode pad 38 is formed integrally with the wiring layer 24. For example, the wiring layer 24 is formed of copper.

The column electrode 25A comprises the post part 35A in the cylindrical form, and the tip 36A having the diameter R2 larger than the diameter R1 of the post part 35A.

The post part 35A and the tip 36A are formed integrally through the plating method which will be mentioned later. Moreover, the whole column electrode 25A is configured in a mushroom-like formation.

The upper end of the post part 35A (on the side where the tip 36A is not formed) is bonded to the wiring layer 24 (the electrode pad 38) integrally. Moreover, the solder ball 27 is arranged at the tip 36A, which is formed at the other end of the post part 35A, through the barrier metal 26. For example, the barrier metal 26 is formed through the metal plating of Au and Ni.

In the composition of FIG. 3, the junction reliability of the column electrode 25A and the solder ball 27 can be raised by forming the barrier metal 26 between the column electrode 25A and the solder ball 27.

Moreover, the diameter R2 of the tip 36A in which the solder ball 27 is arranged as mentioned above is larger than the diameter R1 of the post part 35A (R1<R2), and the bonding area of the solder ball 27 and the tip 36A is larger than that of the column electrode of the cylinder form as in the conventional semiconductor device, and it is possible to raise the junction reliability of the solder ball 27 and the tip 36A.

The encapsulation resin 28 is formed on the circuit formation surface of the semiconductor chip 22. The encapsulation resin 28 is formed in order to protect the wiring layer 24 and the column electrode 25A. For example, an epoxy resin can be used as a material of the encapsulation resin 28.

A description will now be given of the column electrode 25A and the encapsulation resin 28 which constitute the semiconductor device 20A.

In the present embodiment, the semiconductor device 20A is provided so that the column electrode 25A projects from the encapsulation resin 28, and the solder ball 27 which is used as the external connection member is arranged at the end (namely, the tip 36A) of the column electrode 25A projecting from the encapsulation resin 28. Hence, the solder ball 27 is separated from the surface of the encapsulation resin 28.

In the above embodiment, the height amount H2 of the column electrode 25A from the surface of the encapsulation resin 28 (which is the clearance between the surface of the encapsulation resin 28 and the interface of the post part 35A and the tip 36A) is set in a range of between 10 micrometers and 80 micrometers. This clearance is equivalent to about ½–⅓ of the height of the column electrode 25A.

In addition, the clearance H1 between the surface (circuit formation surface) of the semiconductor chip 22 and the interface of the post part 35A and the tip 36A is about 100 micrometers.

Figure 4:
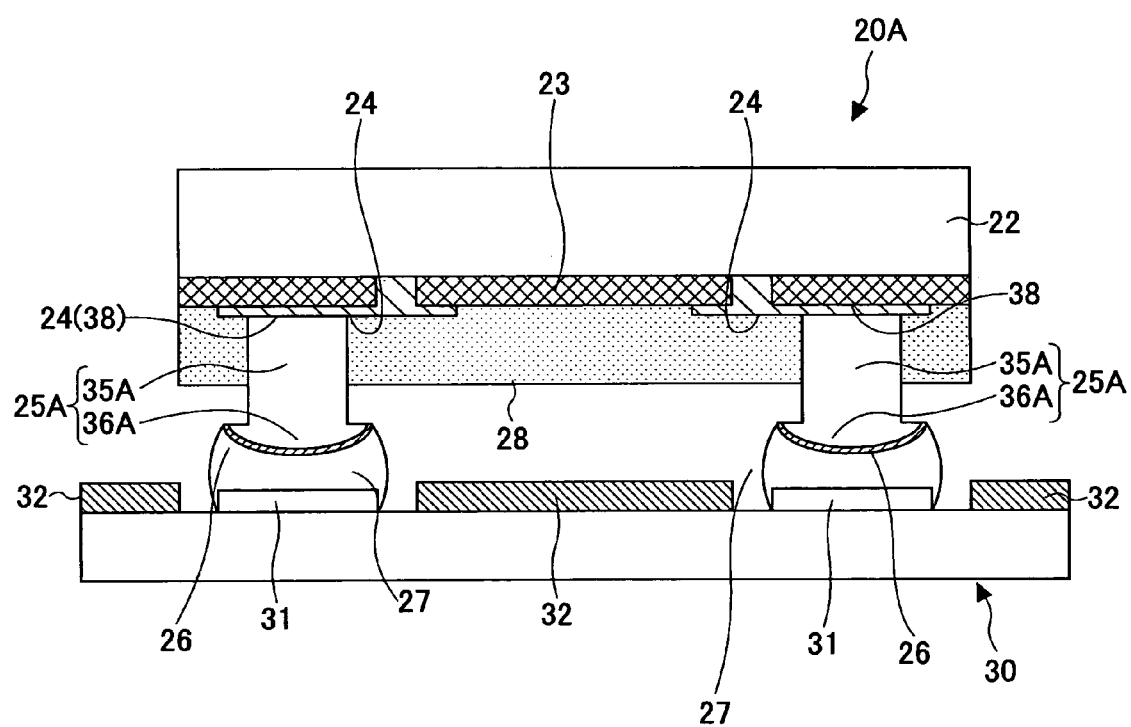
FIG. 4 is a cross-sectional diagram showing the condition in which the structure of the semiconductor device of the first preferred embodiment is mounted on the mounting substrate.

FIG. 4 shows the condition in which the above-mentioned structure of the semiconductor device 20A (wherein the column electrode 25A projects from the surface of the encapsulation resin 28) is mounted on the mounting substrate 30.

In the composition of FIG. 4, the column electrode 25A is made to project from the surface of the encapsulation resin 28, and the solder ball 27 arranged in the tip 36A of the column electrode 25A is also separated from the surface of the encapsulation resin 28.

In addition, the connection electrode 31 corresponding to the forming position of the column electrode 25A in the mounting substrate 30 is formed, and the region other than the forming position of the connection electrode 31 is protected by the solder resist 32.

In the present embodiment, by separating the solder ball 27 and the encapsulation resin 28 from each other, it is possible to prevent the bridging (shorting) of the adjoining solder balls 27 at the time of the mounting shown in FIG. 4.

The semiconductor chip 22 is pressed by the mounting substrate 30 at the time of the mounting, and the compressive force tends to act on the solder ball 27, and the deformation is caused thereby.

Figure 1:
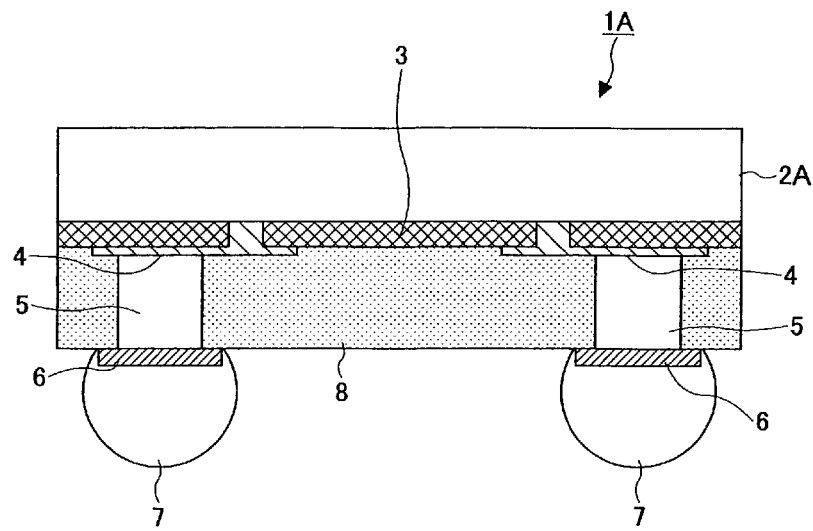
FIG. 1 is a cross-sectional diagram showing the composition of a conventional semiconductor device.
Figure 2:
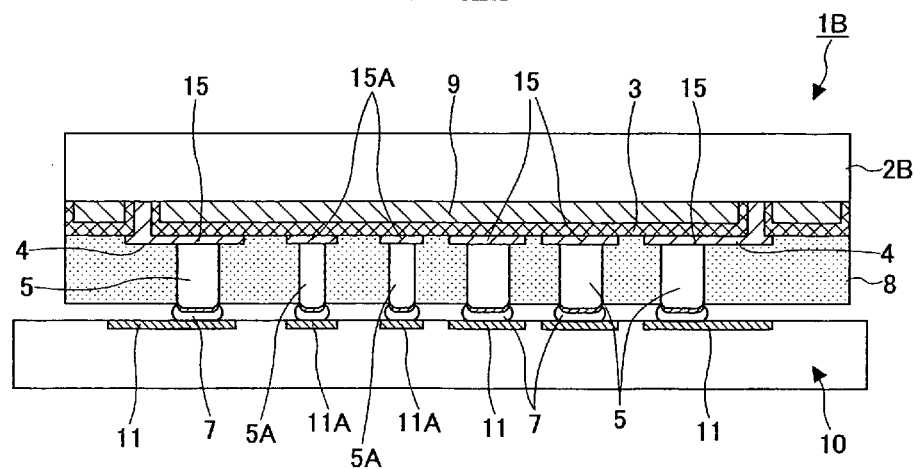
FIG. 2 is a cross-sectional diagram showing the composition of a conventional semiconductor device.

In the composition of the conventional semiconductor device (FIG. 1), the solder ball 7 is in contact with the encapsulation resin 8, and the solder ball 7 tends to deform in the transverse direction (which is the direction to approach the adjoining solder ball 7) by the compressive force, and this will cause the occurrence of the short circuiting.

However, the semiconductor device 20A of the present embodiment is configured so that the solder ball 27 and the encapsulation resin 28 are separated from each other, and the column electrode 25A (the post part 35A) is located between the solder ball 27 and the encapsulation resin 28.

For this reason, even when the solder ball 27 is compressed, the solder ball 27 transfers along the column electrode 25A to the portion where the solder ball 27 and the encapsulation resin 28 are separated. Therefore, it is possible to prevent the occurrence of bridging (short circuiting) between the adjoining solder balls 27, and the mounting reliability can be raised.

Figure 5A:
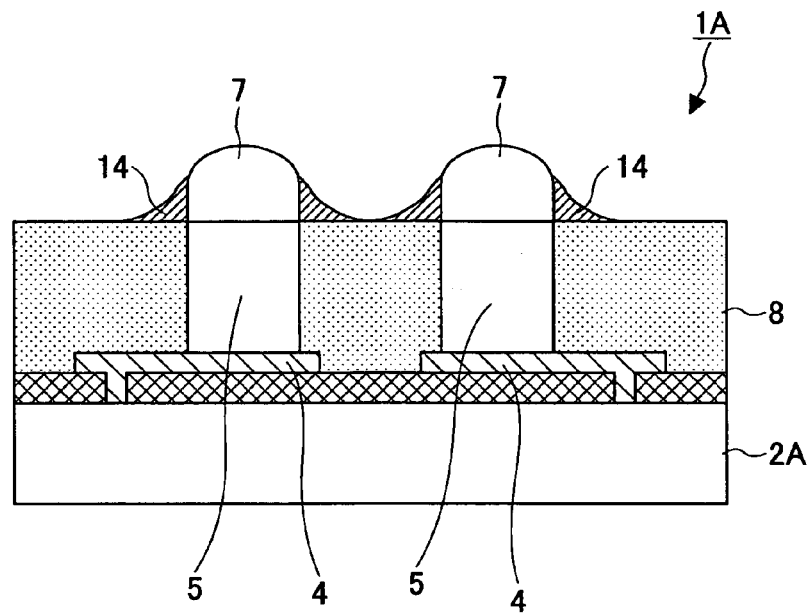
FIG. 5A and FIG. 5B are diagrams for explaining the structure of the semiconductor device of the first preferred embodiment in comparison with the conventional semiconductor device.
Figure 5B:
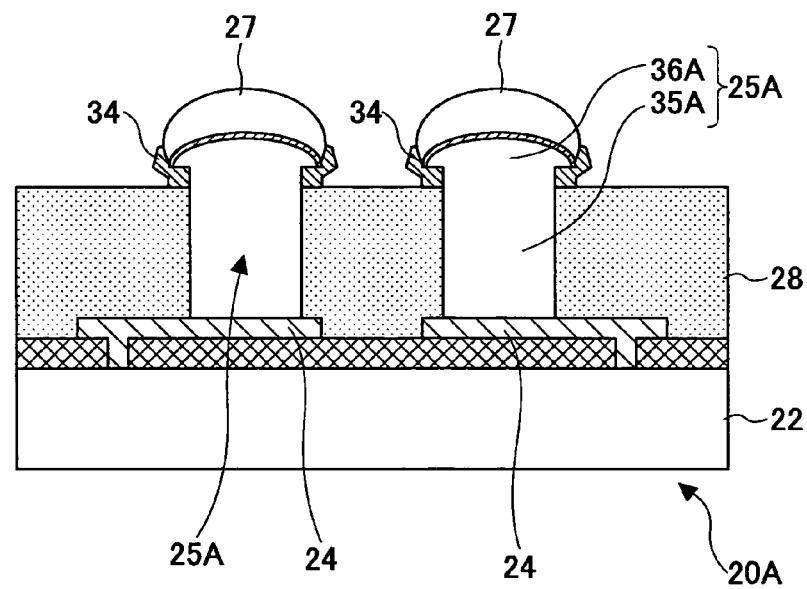

FIG. 5A and FIG. 5B are diagrams for explaining the structure of the semiconductor device of the present embodiment in comparison with the conventional semiconductor device with respect to the ability to prevent the short circuiting (bridging) between the adjoining solder balls 27. FIG. 5A shows the conventional semiconductor device and FIG. 5B shows the semiconductor device of the present embodiment.

The solder ball 27 is arranged in the column electrode 25A through the printing method which generally uses the solder paste.

As is well known, in the solder paste, the solvent component is mixed with the solder powder, and a material of the solvent component with good wettability to the solder is selected.

When forming the solder balls 7 and 27 using the solder paste, the solder paste is printed to the column electrodes 5 and 25A, and the reflow processing is carried out.

By heating at the time of the reflow processing, the liquid-like solvent components 14 and 34 are present from the solder paste.

When the tip of the column electrode 5 is almost flush with the surface of the encapsulation resin 8 as in the conventional semiconductor device shown in FIG. 5A, the solvent component 14 spreads over the surface of the encapsulation resin 8, and easily reaches the position (or the position where the solder ball 7 is formed) of the adjoining column electrode 5.

Since the solvent component 14 has good wettability to the solder as described above, the molten solder spreads along with the solvent component 14. Therefore, the short circuiting (bridging) between the adjoining solder balls 7 may easily occur.

If the adoption of smaller pitch progresses, the spreading range of the solvent component 14 is restricted, and the tendency becomes remarkable.

On the other hand, in the present embodiment, it is configured so that the solder ball 27 and the surface of the encapsulation resin 28 are separated from each other. As shown in FIG. 5B, the solvent component 34 stops with the surface tension between the tip 36A of the column electrode 25A and the surface of the encapsulation resin 28, and it does not spread on the surface of the encapsulation resin 28. Therefore, it is possible to prevent the occurrence of the short circuiting between the adjoining solder balls 27.

Moreover, the solder ball 27 and the surface of the encapsulation resin 28 are separated from each other in the present embodiment, and it is possible to prevent the separation of the solder ball 27 from the column electrode 25A due to the stress concentration.

Figure 6A:
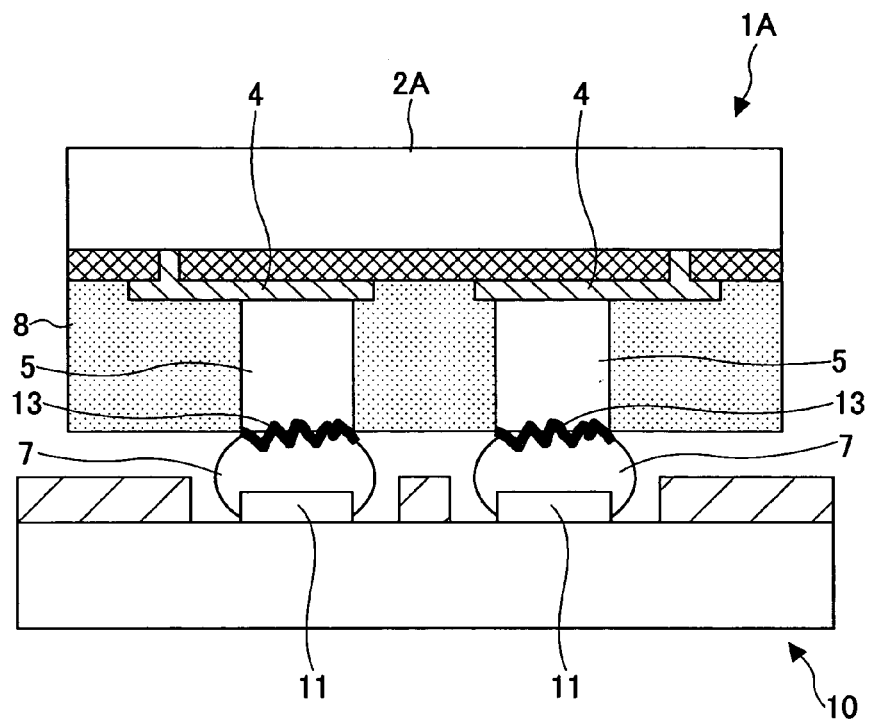
FIG. 6A and FIG. 6B are diagrams for explaining the structure of the semiconductor device of the first preferred embodiment in comparison with the conventional semiconductor device.
Figure 6B:
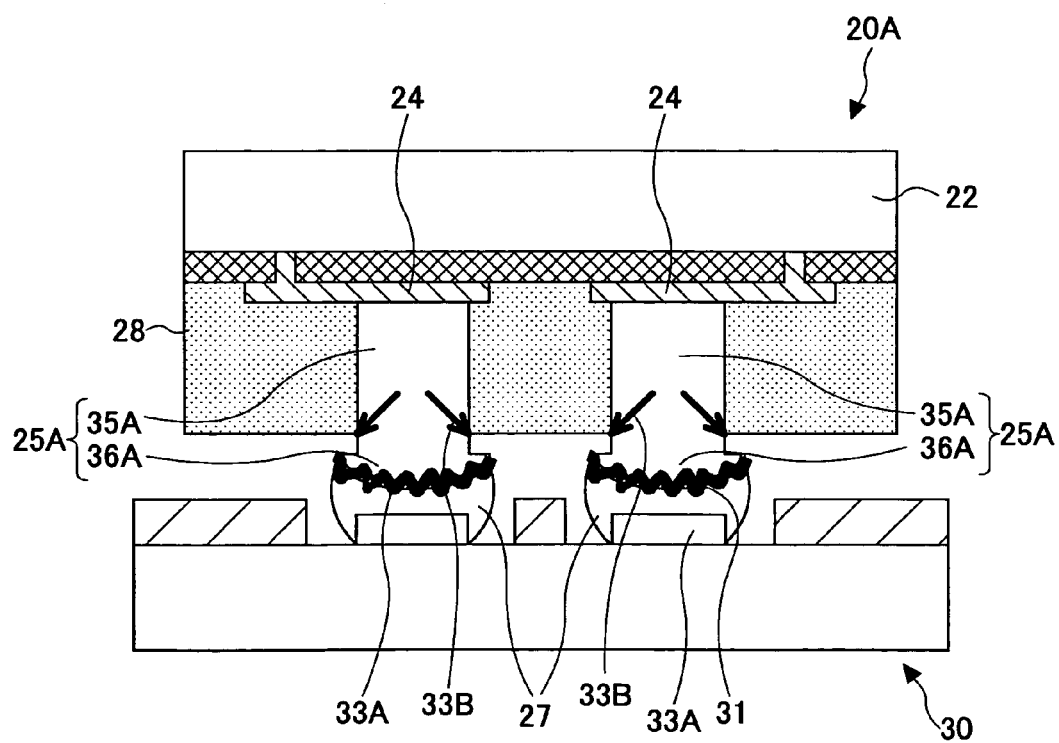

FIG. 6A and FIG. 6B are diagrams for explaining the structure of the semiconductor device of the present embodiment in comparison with the conventional semiconductor device with respect to the ability to prevent the separation of the solder ball 27 from the column electrode 25A. FIG. 6A shows the conventional example and FIG. 6B shows the semiconductor device of the present embodiment.

In the conventional semiconductor device 1A of FIG. 6A, the tip of the column electrode 5 is almost flush with the surface of the encapsulation resin 8, and the time of mounting the conventional semiconductor device 1A, the stress concentration occurs at the interface of the column electrode 5 and the solder ball 7 (the position of the interface will be called the stress raiser 13).

Thus, in the conventional semiconductor device 1A, the stress is concentrated at the stress raiser 13, and the separation of the solder ball 7 from the column electrode 5 may occur frequently.

On the other hand, in the semiconductor device 20A of the present embodiment shown in FIG. 6B, the mounting reliability can be raised with the enlarged diameter of the tip 36A and the increased bonding area of the solder ball 27 and the column electrode 25A.

Furthermore, in the present embodiment, the solder ball 27 and the encapsulation resin 28 are separated from each other, and the place where the stress is impressed at the time of mounting can be made to disperse to the interface (the first stress raiser 33A) of the column electrode 25A and the solder ball 27 and the interface (the second stress raiser 33B) of the surface of the encapsulation resin 28 and the side surface of the column electrode 25A. Thus, by dispersing the stress, it is possible to prevent the separation of the solder ball 27 from the column electrode 25A, and the further improvement in the mounting reliability can be realized.

Moreover, by making the encapsulation resin 28 thin in order to separate the solder ball 27 and the encapsulation resin 28 from each other, the curvature that may be present in the semiconductor device 20A can be prevented.

That is, there is a large difference in the coefficient of thermal expansion between the resin (such as an epoxy resin) of the encapsulation resin 28 and the silicon of the semiconductor chip 22. In the conventional semiconductor device, the height of the column electrode is the same as the thickness of the encapsulation resin, and it is impossible to set up the thickness of the encapsulation resin arbitrarily.

If the encapsulation resin is thick, the influence of the heat deformation of the encapsulation resin will be significant, and the curvature of the semiconductor device will easily occur due to the thermal expansion difference of the semiconductor chip and the encapsulation resin.

On the other hand, in the present embodiment, the thickness of the encapsulation resin 28 can be set up irrespective of the height of the column electrode 25A, and the encapsulation resin 28 can be made thin. Thereby, the influence of the thermal expansion of the encapsulation resin 28 in the semiconductor device 20A can be made small, and the amount of the curvature present in the semiconductor device 20A can be reduced.

As described above, it is desirable that the clearance between the surface of the encapsulation resin 28 and the solder ball 27 is in a range of between 10 micrometers and 80 micrometers. If the clearance is set to be smaller than 10 micrometers, the possibility that the short circuiting of the adjoining solder balls 27 occurs is increased. If the clearance is set to be larger than 80 micrometers, it becomes difficult to ensure the protection of the wiring layer 24 and the column electrode 25A which is the original function of the encapsulation resin 28.

Since the stress concerning the stress raiser itself declines by the reduction of the curvature, the improvement in the further mounting reliability is realizable.

Next, the manufacture method of the semiconductor device 20A in the first preferred embodiment will now be explained.

FIG. 7A through FIG. 7F show the manufacture method of the semiconductor device 20A in the present embodiment.

In order to manufacture the semiconductor device 20A, the insulating film 23, such as polyimide, is formed through the spin coating method etc. on the surface of the semiconductor substrate 21 (the dicing is carried out subsequently and it becomes the semiconductor chip 22) on which the circuit formation is performed in advance, and the hole 23a in the insulating film 23 is formed at the position corresponding to the position of the electrode part of the semiconductor substrate 21.

Figure 7A:
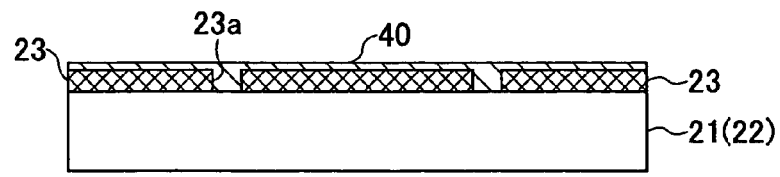
FIG. 7A through FIG. 7F are diagrams for explaining the method of manufacturing the semiconductor device in the first preferred embodiment of the invention.

Next, the semiconductor substrate 21 in which the insulating film 23 is formed is mounted on the sputtering device, and the sputtering film 40, used as the seed layer of the electrolysis metal plating which will be mentioned later, is formed. FIG. 7A shows the condition in which the sputtering film 40 is formed. The material of the sputtering film 40 may be any metal from among those such as titanium (Ti), chromium (Cr) and copper (Cu) if the metal has the barrier metal effect.

Figure 7B:
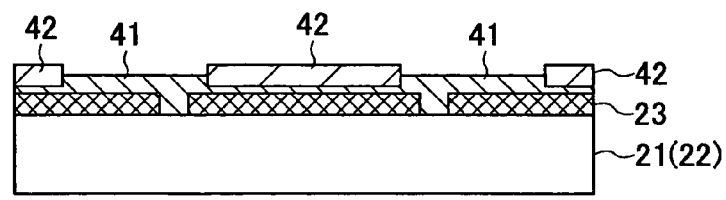

Next, the wiring resist 42 having the opening (pattern) corresponding to the form of the wiring layer 24 is formed on the upper part of the sputtering film 40. And the electrolysis metal plating of copper is performed by using the above mentioned sputtering film 40 as the seed layer. As shown in FIG. 7B, the metal-plating layer 41 is formed.

After removing the wiring resist 42, the electrode resist 43 having the opening (pattern) corresponding to the column electrode 25A is arranged on the upper part of the metal-plating layer 41. For example, the dry film resist (DFR) can be used as the material of the electrode resist 43.

Figure 7C:
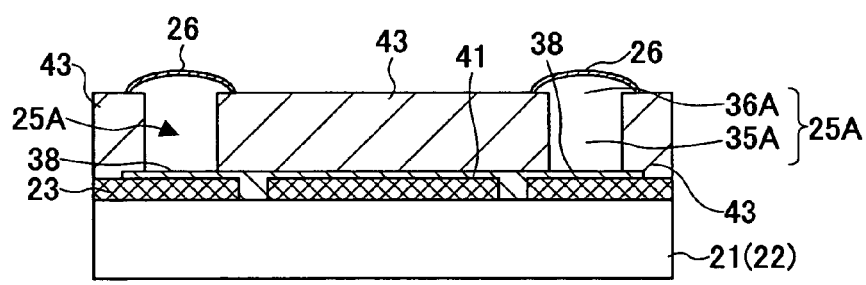

And the electrolysis metal plating of copper is performed by using the sputtering film 40 and the metal-plating layer 41 as the power supply layer. As shown in FIG. 7C, the column electrode 25A is formed.

In addition, copper (Cu) is used in the present embodiment as the material of the metal-plating layer 41 (wiring layer 24) and the column electrode 25A. However, as long as it is the metal with which the metal plating growth is possible, it is possible to use any other metal instead of copper.

When the electrolysis metal plating is completed, as shown in FIG. 7C, the column electrode 25A is formed with the tip 36A, and the tip 36B which has the diameter larger than the diameter of the tip 36A.

In order to form the column electrode 25A having the above configuration, the copper-plating processing to form the column electrode 25A is performed until it exceeds the thickness of the electrode resist 43. Thereby, the tip 36A having the diameter and area larger than the diameter and area of the post part 35A is formed on the upper surface of the electrode resist 43.

In the present embodiment, after the column electrode 25A is formed in this manner, the barrier metal 26 is formed on the surface of the tip 36A by performing the metal plating of golden (Au) and nickel (Ni).

When the column electrode 25A and the barrier metal 26 are formed as mentioned above, the removal of the electrode resist 43 is performed.

Next, the unnecessary portion of the metal-plating layer 41 is removed by etching, and thereby the wiring layer 24 of a predetermined form which has the electrode pad 38 is formed. Moreover, in this condition, the column electrode 25A is set up on the electrode pad 38 (not shown).

Next, the transfer-mold processing (for example, about 175 degrees C.) is performed with the semiconductor substrate 21 in which the column electrode 25A is formed being arranged in the mold, in order for forming the encapsulation resin 28. At this time, the resin film is infixed to the portion where the tip 36A of the column electrode 25A contacts the mold cavity of the mold. Thereby it is prevented that the resin adheres to the column electrode 25A, and the deformation of the tip 36A is prevented.

Thus, the encapsulation resin 28 is formed using the transfer molding method, and it is possible to carry out the encapsulation of the column electrode 25A with the encapsulation resin 28 regardless of the height of the column electrode 25A. It is also possible to choose the coefficient of linear expansion etc. freely since the amount of filler and the size in the encapsulation resin 28 can be freely changed.

Figure 7D:
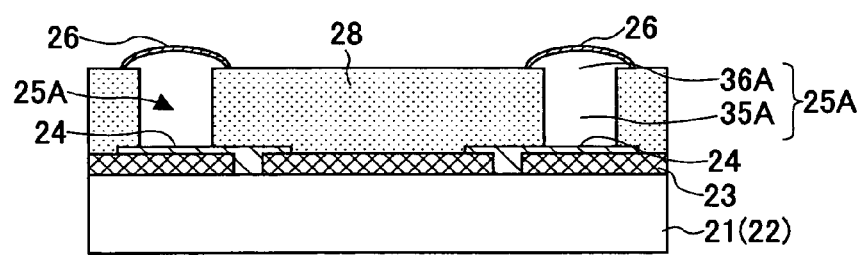
Figure 7E:
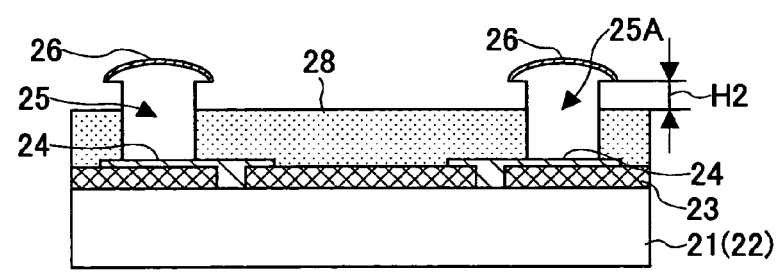

FIG. 7D shows the condition in which the encapsulation resin 28 is formed on the semiconductor substrate 21. As shown in FIG. 7E, the surface of the encapsulation resin 28 is located, immediately after the transfer molding is performed, at the boundary portion of the post part 35A and the tip 36A.

After the formation of the encapsulation resin 28 is completed as mentioned above, the processing to make the thickness of the encapsulation resin 28 small is carried out.

In the present embodiment, etching processing is used as the method of making the thickness of the encapsulation resin 28 small thin.

After the etching processing is performed, the tip (tip 36A) of the column electrode 25A and the surface of the encapsulation resin 28 are separated from each other by the distance H2 as shown in FIG. 7E.

The etching device is the device which is generally used for the resist removal. Therefore, by using the etching device, the encapsulation resin 28 can be made thin with ease and low cost with no need to introduce a new device.

Moreover, even if the unnecessary resin adheres to the surface of the column electrode 25A at the time of the formation of the encapsulation resin 28, the unnecessary resin can be removed by using the etching device. Thereby, the solder ball 27 can be certainly arranged to the column electrode 25A, and improvement in the yield at the time of the formation of the solder ball 27 can be aimed at.

At the end of the etching processing, the processing which forms the solder ball 27 in the column electrode 25A is continuously performed. The method of forming the solder ball 27 may include: the transferring method in which the solder balls formed, in advance, in another process are mounted on the column electrode 25A; and the reflow method (also called the printing method) in which, after printing the solder to the column electrode 25A, the solder ball is formed through reflow processing.

In the case of the adoption of small pitch with the diameter of the solder ball 27 smaller than 0.5 mm, the jig for ball loading becomes expensive, and the printing method is more advantageous than the transferring method.

Moreover, the material of the solder ball 27 may be the eutectic solder or the so-called lead-free solder. It is not limited to a specific material, and either of such solder materials may be used.

Figure 7F:
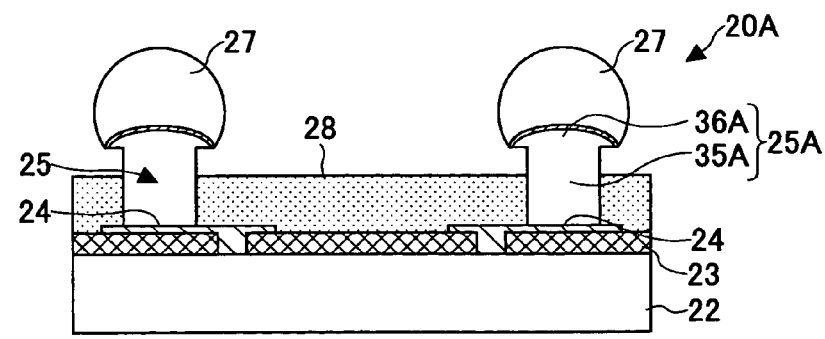

Then, the semiconductor device 20A shown in FIG. 7F is manufactured by carrying out the dicing of the semiconductor substrate 21 to cut the same into pieces corresponding to the semiconductor chip 22.

In the manufacture method of the semiconductor device 20A of the present embodiment, after making the end (tip 36A) of the column electrode 25A separate from the surface of the encapsulation resin 28 by making the encapsulation resin 28 thin, in order to form the solder ball 27 in the end of the column electrode 25A.

As previously explained using FIG. 5, even if the solvent component 34 is present at the time of the reflow of the solder ball 27, it is possible to prevent the occurrence of the short circuiting (bridging) between the adjoining solder balls 27.

Next, the semiconductor devices 20B–20D in the second to fourth preferred embodiments of the invention will be explained using FIG. 8 to FIG. 10.

Figure 8:
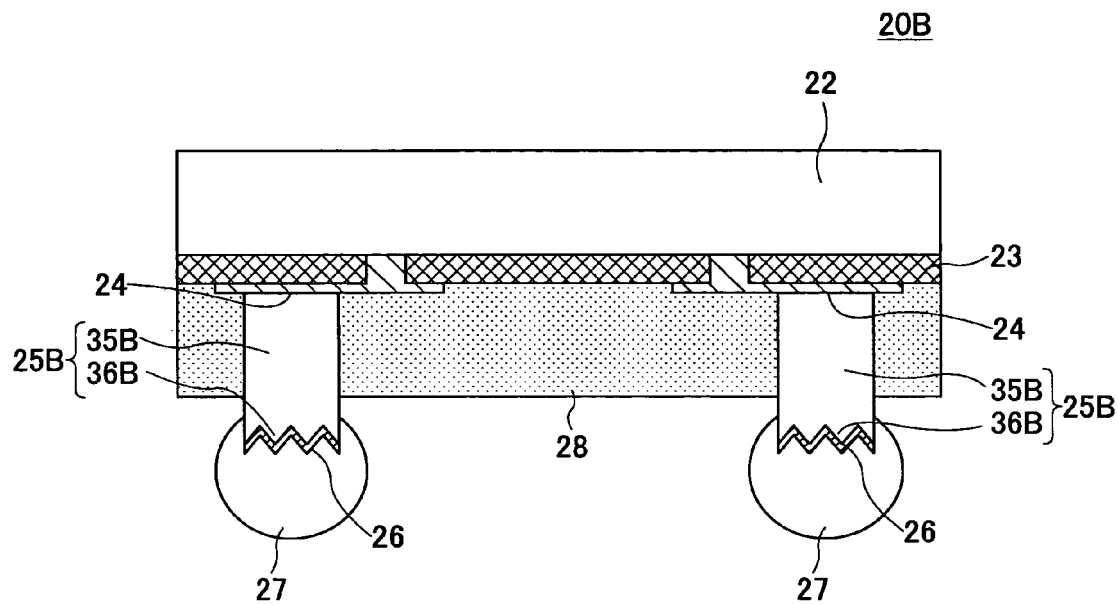
FIG. 8 is a cross-sectional diagram showing the composition of a semiconductor device in the second preferred embodiment of the invention.
Figure 9:
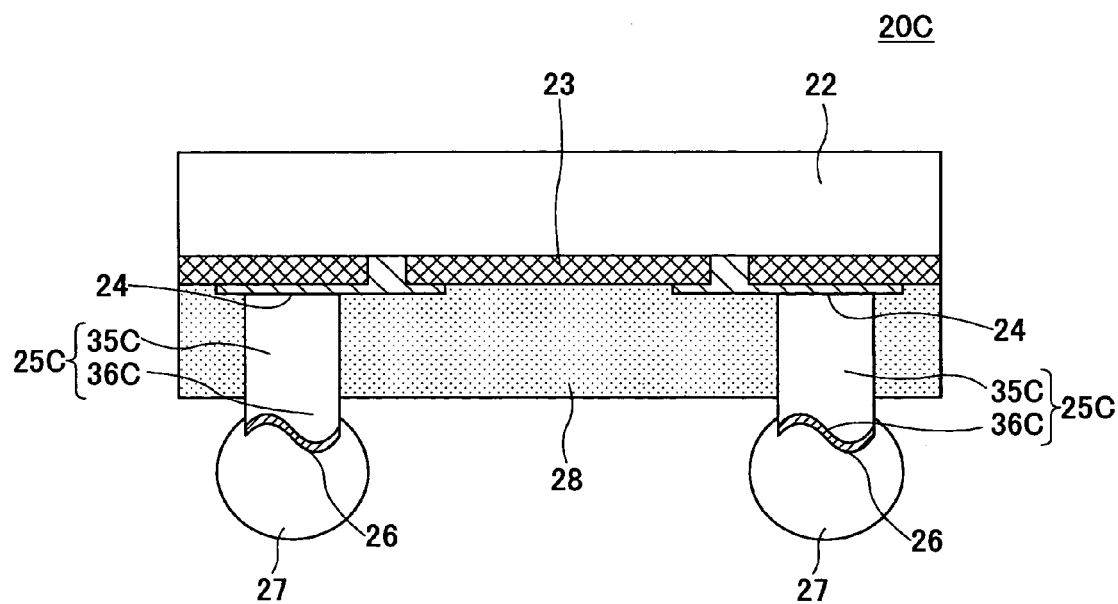
FIG. 9 is a cross-sectional diagram showing the composition of a semiconductor device in the third preferred embodiment of the invention.
Figure 10:
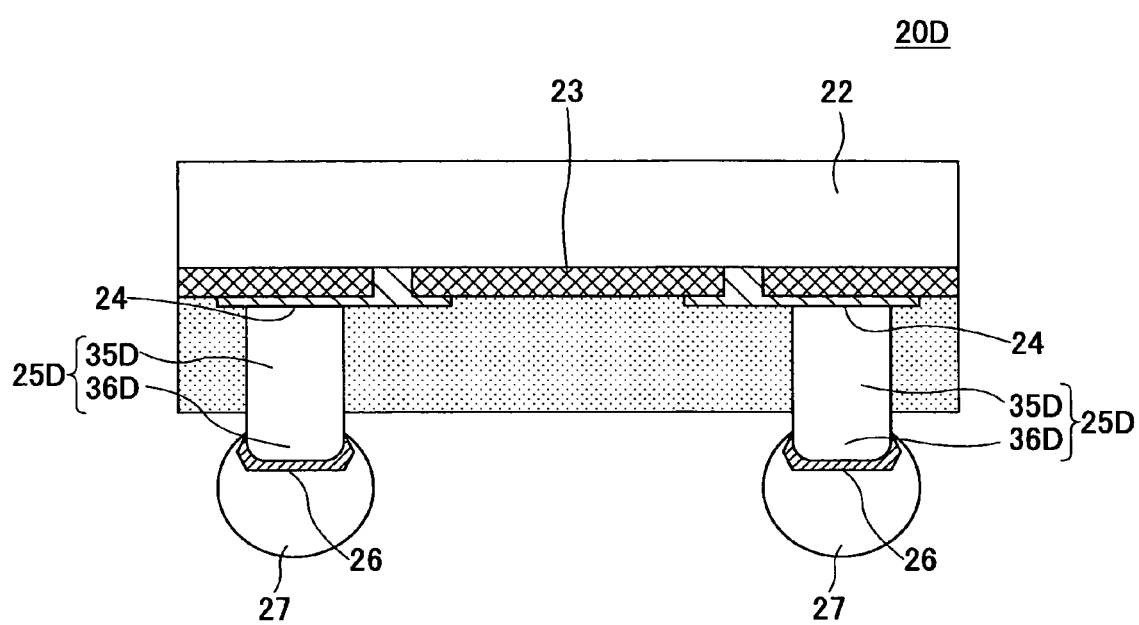
FIG. 10 is a cross-sectional diagram showing the composition of a semiconductor device in the fourth preferred embodiment of the invention.

In addition, in FIG. 8 through FIG. 10, the elements that are the same as corresponding elements in FIG. 2 through FIG. 7 are designated by the same reference numerals, and a description thereof will be omitted.

Similar to the first preferred embodiment, the column electrodes 25B–25D in the semiconductor devices 20B–20D in the second to fourth preferred embodiments shown in FIG. 8 to FIG. 10 comprise the post parts 35B–35D and the tips 36B–36D, respectively.

Moreover, in the semiconductor devices 20B–20D, the tips 36B–36D of the column electrodes 25B–25D project from the surface of the encapsulation resin 28, and, therefore, the solder ball 27 is separated from the surface of the encapsulation resin 28.

The semiconductor device 20B of the second preferred embodiment is provided so that the contact area of the solder ball 27 and the column electrode 25B is increased by forming the sawtooth unevenness on the tip 36B.

Moreover, the semiconductor device 20C of the third preferred embodiment is provided so that the contact area of the solder ball 27 and the column electrode 25C is increased by forming the wavelike unevenness on the tip 36C.

Furthermore, the semiconductor device 20D of the fourth preferred embodiment is provided so that the contact area of the solder ball 27 and the column electrode 25D is increased and the solder ball 27 can also touch the side surface of the tip 36D by forming the barrier metal 26 to the side part of the tip 36D.

With respect to each of the semiconductor devices 20B–20D in the second to fourth preferred embodiments, the tips 36B–36D of the column electrodes 25B–25D project from the surface of the encapsulation resin 28, and an increase of the contact area of the solder ball 27 and the tips 36B–36D from that in the first preferred embodiment mentioned above is achieved. Therefore, the same effect as the above-described semiconductor device 20A of the first preferred embodiment is realizable.

FIGS. 11A to 11F and FIGS. 12A and 12B show the manufacture method of the semiconductor device 20B in the second preferred embodiment.

In addition, a description of the processing which is the same as in the manufacture method of the semiconductor device 20A of the first preferred embodiment will be omitted.

Figure 11A:
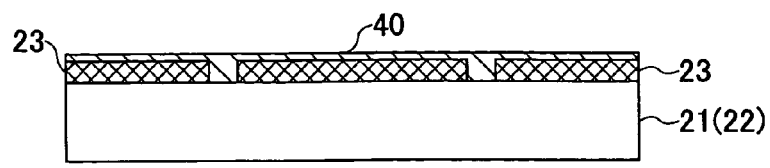
FIG. 11A through FIG. 11F are diagrams for explaining the method of manufacturing the semiconductor device in the second preferred embodiment of the invention.
Figure 11B:
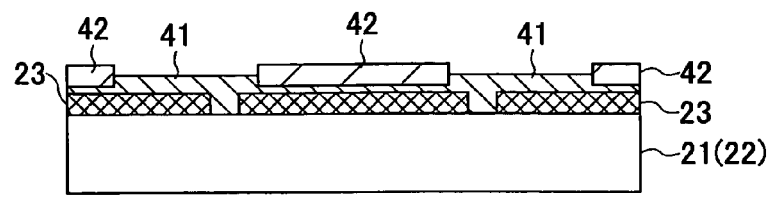

The processing shown in FIG. 11A and FIG. 11B is the same as that of the manufacture method of the semiconductor device 20A described above using FIG. 7A through FIG. 7F.

After the metal-plating layer 41 is formed as shown in FIG. 11B, the same processing as described above using FIG. 7C is carried out, and the column electrode 25B is formed in the resist 43 for the electrodes.

In the first preferred embodiment shown in FIG. 7C, the tip 36A is formed in the upper part of the resist 43 for the electrodes. However, in the present embodiment, before the tip 36A is formed, the electrolysis metal plating is suspended. Thereby, in the present embodiment, the column electrode 25B (refer to FIG. 12A) is formed through the electrolysis metal plating.

After the column electrode 25B of the cylindrical configuration is formed in this way, the processing which forms the tip 36B with sawtooth unevenness in the column electrode 25B is performed.

Figure 12A:
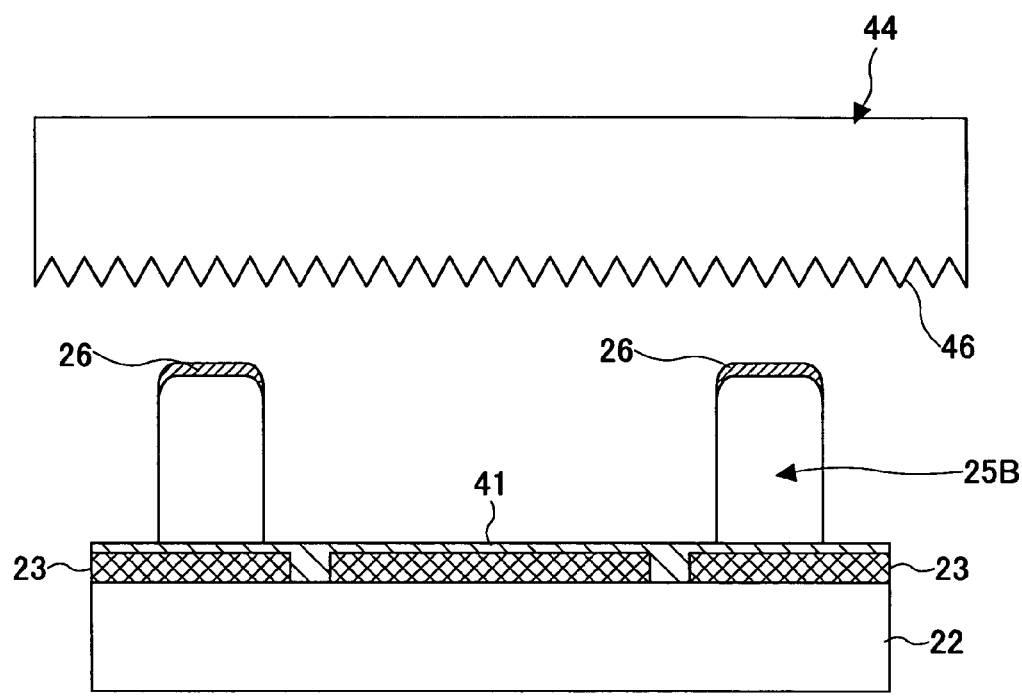
FIG. 12A and FIG. 12B are diagrams for explaining how to form unevenness at the tip of the column electrode in the method of manufacturing the semiconductor device in the second preferred embodiment of the invention.
Figure 12B:
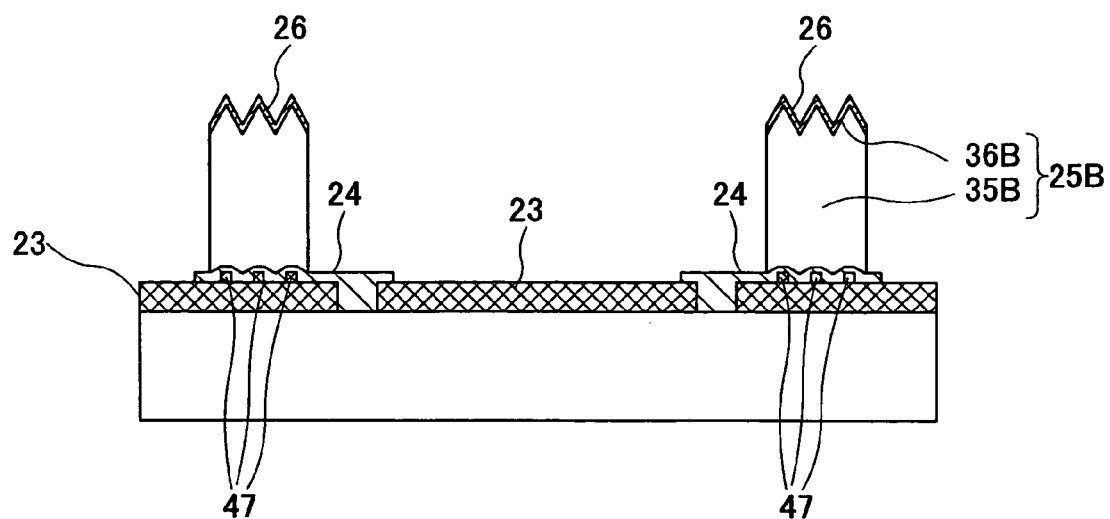

FIG. 12A and FIG. 12B show the method of forming the tip 36B with sawtooth unevenness.

In the method of FIG. 12A, the sawtooth unevenness is formed in the tip 36 of the column electrode 25B by pressing the jig 44 in which the sawtooth unevenness part 46 is formed onto the column electrode 25B (the barrier metal 26 being formed).

In this method, the forming of the column electrode 25B can be performed by the stamping using the press, and the productivity of the semiconductor device 20B can be raised.

In the method of FIG. 12B, before the sputtering film 40 shown in FIG. 11A is formed, the convex part 47 is formed, in advance, in the portion of the insulating film 23 where the column electrode 25B is formed. The convex part 47 is formed integrally with the insulating film 23.

Thus, the form of the convex part 47 will remain in the surface of the sputtering film 40, the surface of the metal-plating layer 41, and the tip of the column electrode 25B after metal plating by carrying out the metal-plating formation of the sputtering film 40, the metal-plating layer 41, and the column electrode 25B on the insulating film 23 in which the convex part 47 is formed. Thereby, the sawtooth unevenness is formed in the tip 36B of the column electrode 25B.

Since the jig 44 is not used unlike the composition of FIG. 12A when this method is used, the simplification of the manufacturing process can be attained.

Moreover, the form of the tip 36B can be arbitrarily set up by changing the form of the convex part 47 suitably. For example, it is also possible form the semiconductor device 20C in the third preferred embodiment of FIG. 9 by setting the form of the convex part 47 into a wave-like shape.

Figure 11C:
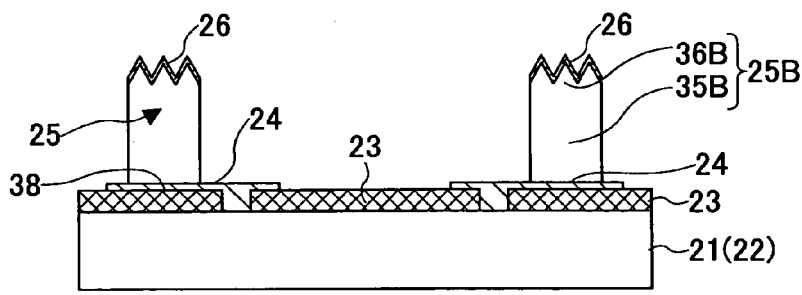

Referring back to FIG. 11C, a description of the manufacturing method will be continued. FIG. 11C shows the state where the sawtooth unevenness is formed in the tip 36B of the column electrode 25B as mentioned above.

Moreover, the unnecessary portion of the metal-plating layer 41 is removed by etching, and thereby the wiring layer 24 in the predetermined form which has the electrode pad 38 is formed.

Moreover, the column electrode 25A in this state is raised up on the electrode pad 38 formed in the wiring layer 24.

Next, the semiconductor substrate 21 in which the column electrode 25B is formed is placed into the mold, and the transfer molding processing for forming the encapsulation resin 28 is carried out.

Figure 11D:
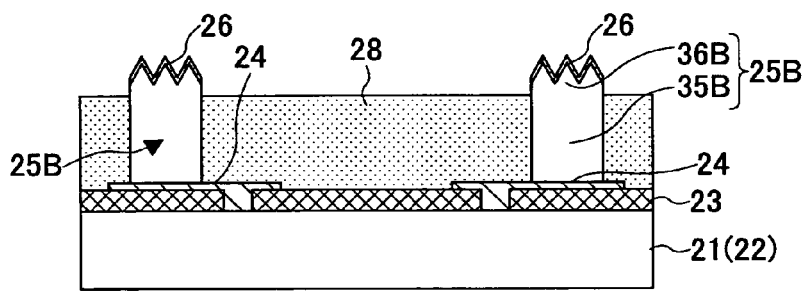

Immediately after the end of the transfer molding, the surface of the encapsulation resin 28 is located to the boundary between the post part 35B and the tip 36B as shown in FIG. 11D.

After the processing of formation of the encapsulation resin 28 is completed as mentioned above, the etching processing which makes the thickness of the encapsulation resin 28 small is carried out.

Figure 11E:
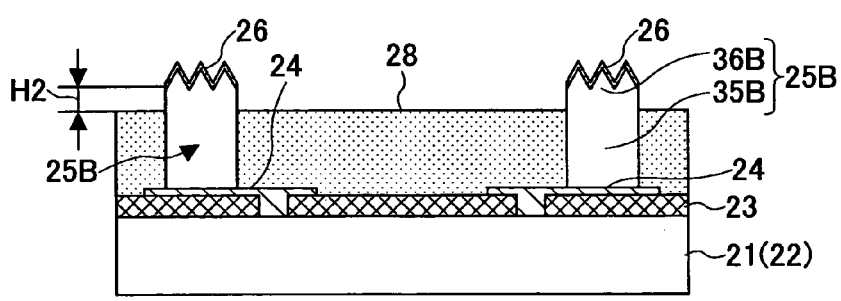

By carrying out the etching processing, as shown in FIG. 11E, the tip (the tip 36B) of the surface of the encapsulation resin 28 and the column electrode 25B are separated by the distance H2.

After the end of the etching processing, the processing which forms the solder ball 27 in the column electrode 25A is performed continuously.

Figure 11F:
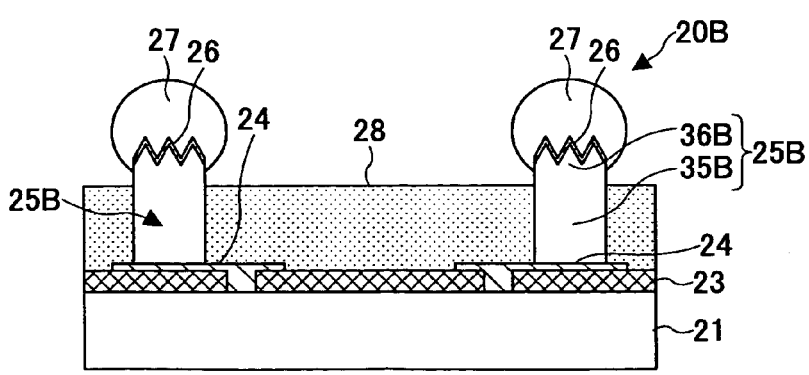

After the end of the above process, the semiconductor device 20B shown in FIG. 11F is manufactured.

Figure 13A:
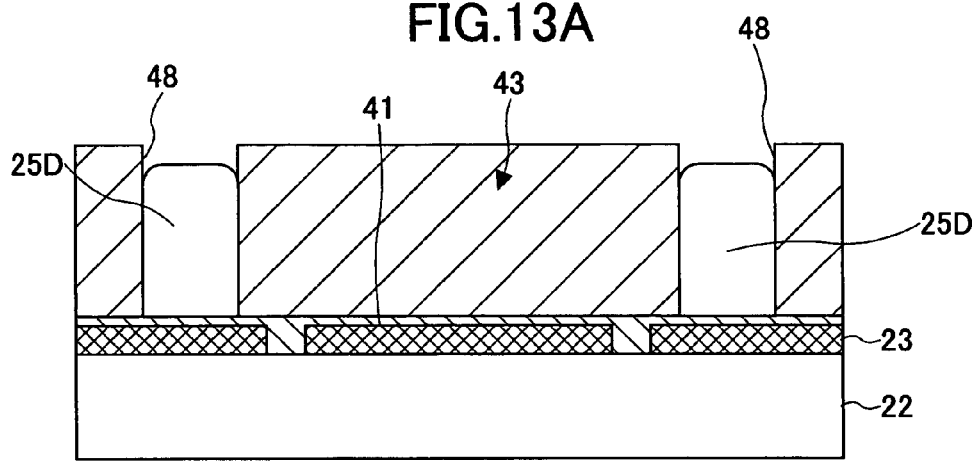
FIG. 13A through FIG. 13C are diagrams for explaining the method of manufacturing the semiconductor device in the fourth preferred embodiment of the invention.
Figure 13B:
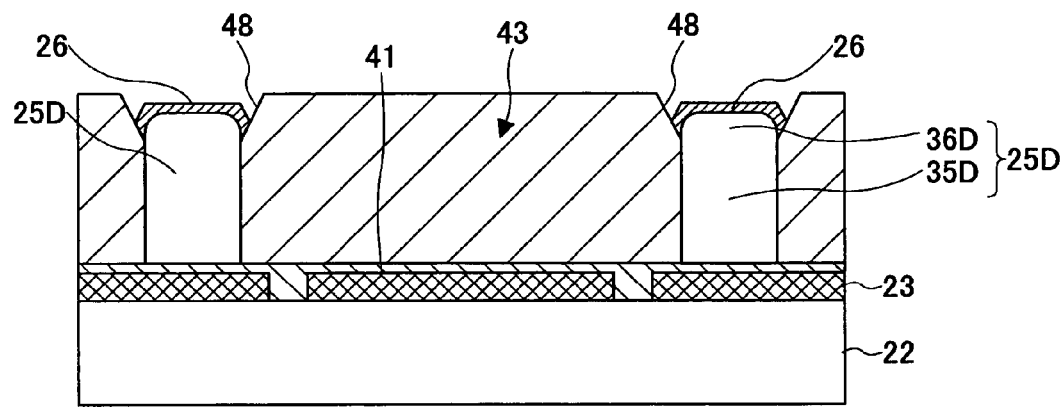
Figure 13C:
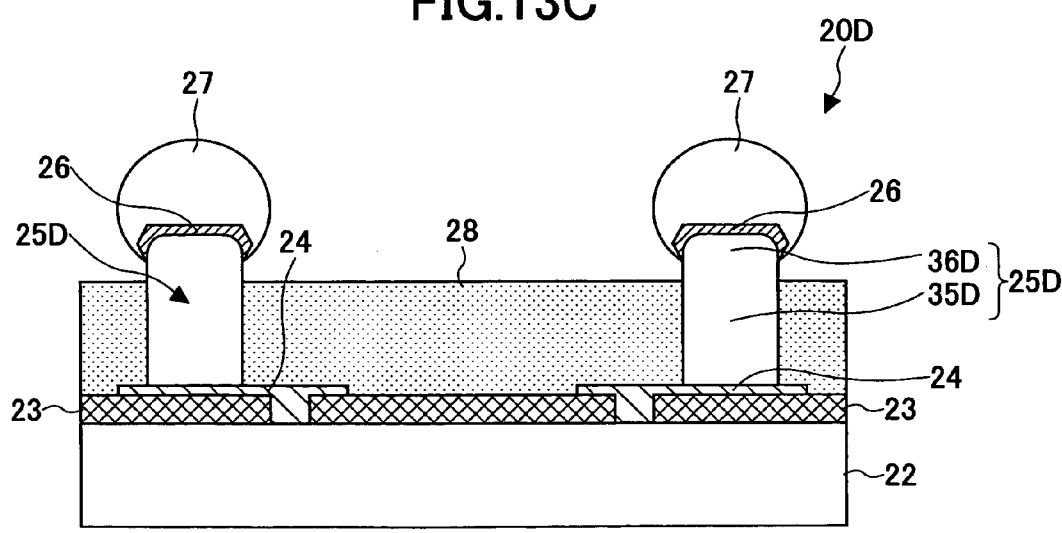

FIGS. 13A to 13C show the manufacture method of the semiconductor device 20D in the fourth preferred embodiment.

In addition, in the following explanation, a description of the processing which is the same as in the manufacture method of the semiconductor device 20A in the first preferred embodiment will be omitted suitably.

Moreover, the manufacturing method in the present embodiment is characterized by the method of arranging the barrier metal 26 in the column electrode 25D, and only a description how to arrange the barrier metal 26 in the column electrode 25D will be given.

FIG. 13A shows the state in which the column electrode 25D is formed, in the opening 48 formed in the resist 43 for the electrodes (which includes the DFR), through the electrolysis metal plating.

After the end of the formation of the column electrode 25D, the heat treatment to the resist 43 for the electrodes is performed.

The heat treatment varies depending on the material of the DFR used as the resist 43 for the electrodes. For example, as shown in FIG. 13B, the end of the opening 48 of the resist 43 for the electrodes can be spread by heating it at a temperature of 100–200 degrees C. for 5 to 60 minutes. By this heat treatment, the form of the end of the opening 48 is turned into a trumpet-like form.

Moreover, when the end of the opening 48 is spread in this way, the tip 36D of the column electrode 25D will be in the state where it is widely exposed to the outside.

Next, the processing which arranges the barrier metal 26 to the tip 36D of the column electrode 25D in this state is performed. Thereby, the barrier metal 26 is arranged to the side of the part 36.

Therefore, since the barrier metal 26 is formed to the side part of the column electrode 25D (the tip 36D) when the solder ball 27 is arranged in the column electrode 25D in the next process, the solder ball 27 can be formed to the side part of the column electrode 25D (the tip 36D).

Thereby, the contact area of the solder ball 27 and the column electrode 25D can be increased.

Next, the semiconductor devices 20E and 20F which are the fifth and sixth preferred embodiments of the present invention will be explained.

Figure 14:
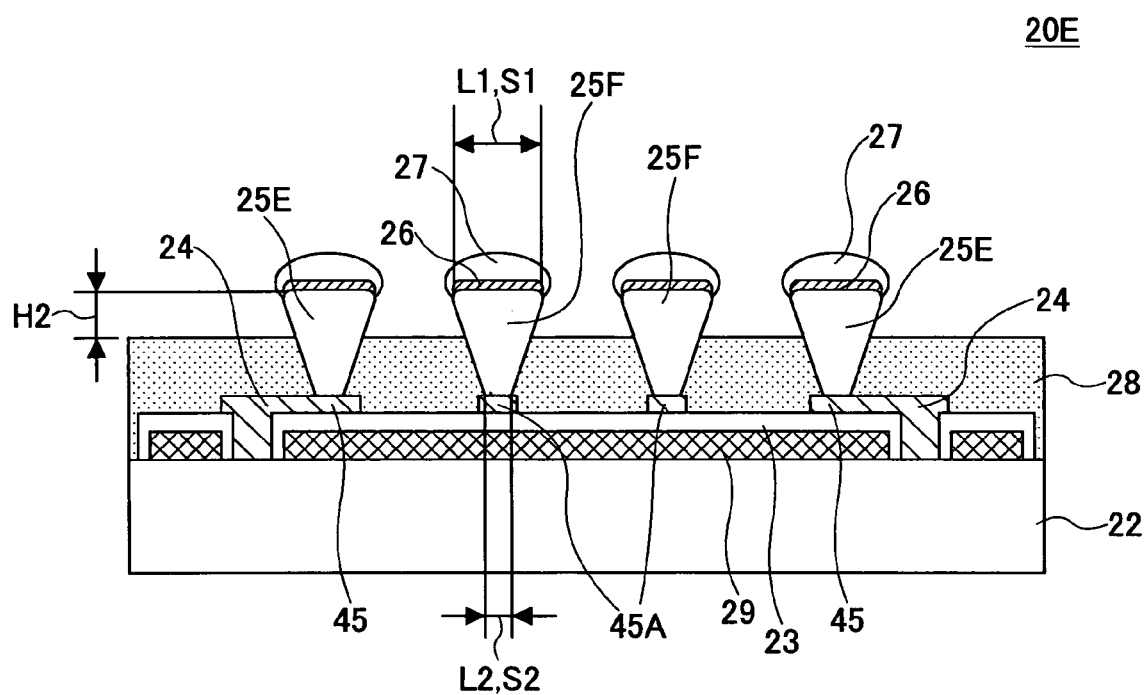
FIG. 14 is a cross-sectional diagram showing the composition of a semiconductor device in the fifth preferred embodiment of the invention.

FIG. 14 shows the semiconductor device 20E in the fifth preferred embodiment, and FIGS. 15A to 15F show the manufacture method of the semiconductor device 20E.

Figure 16:
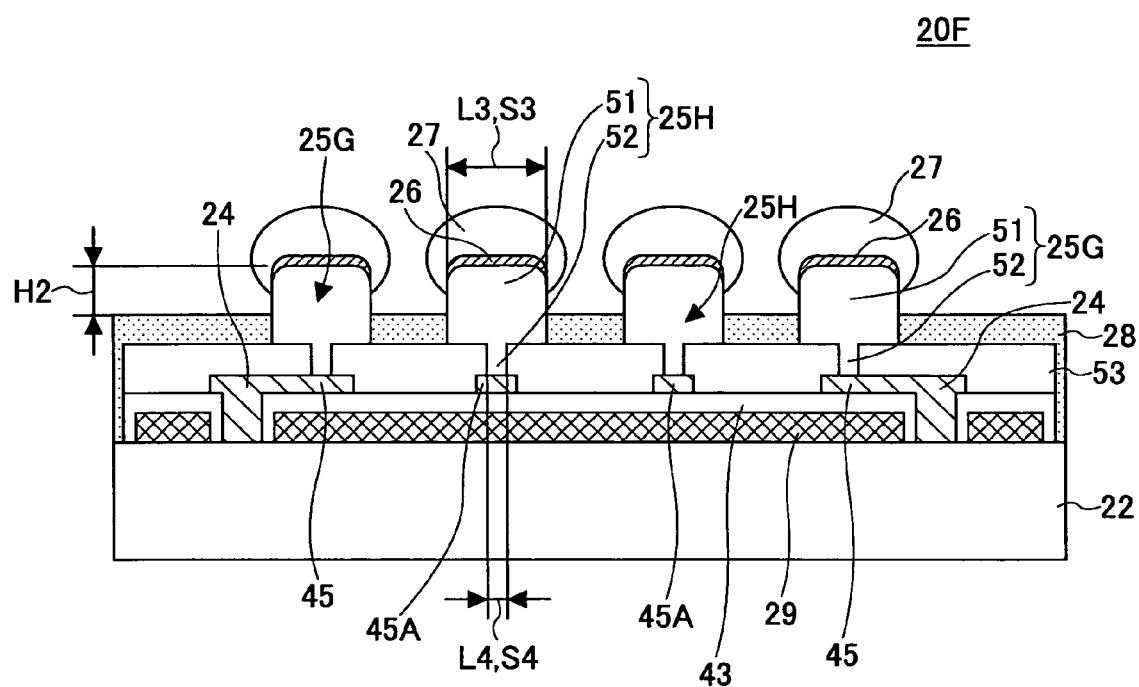
FIG. 16 is a cross-sectional diagram showing the composition of a semiconductor device in the sixth preferred embodiment of the invention.

Moreover, FIG. 16 shows the semiconductor device 20F in the sixth preferred embodiment, and FIGS. 17A to 17G show the manufacture method of the semiconductor device 20F.

Each of the semiconductor device 20E and the semiconductor device 20F is the semiconductor device dealing with the signal of the high frequency (500 MHz or more).

As described above, in order to realize reduction of the parasitic capacitance, it is desirable that, in the semiconductor devices 20E and 20F dealing with the high frequency signal, the column electrodes dealing with the high frequency signal, in the junction position in contact with the semiconductor chip 22, are made smaller in size than other column electrodes which do not deal with the high frequency signal.

However, in the composition of the conventional semiconductor device 1B in which only the column electrode 5A dealing with the high frequency signal is made small to improve the transmission characteristic of the high-frequency column electrode 5A, the mounting reliability declines as described above.

To resolve the problem, the semiconductor device 20E shown in FIG. 14 is constituted so that the diameter (L1) of the portion which touches the solder ball 27 of the high-frequency column electrode 25F which deals with the high frequency signal is larger than the diameter (L2) of the portion which touches the high-frequency electrode pad 45A (the wiring layer 24) (L1>L2).

Therefore, the area (S1) of the portion which touches the solder ball 27 of the high-frequency column electrode 25F is larger than the area (S2) of the portion which touches the high-frequency-electrode-pad 45A (wiring layer 24) (S1>S2).

In addition, although the high-frequency electrode pad 45A is formed integrally with the wiring layer 24 similar to the usual electrode pad 45, it is connected with the connection pad dealing with the high frequency signal in the semiconductor chip 22.

In the present embodiment, the high-frequency column electrode 25F is formed so that the cross-section area thereof increases continuously according to its distance from the high-frequency electrode pad 45A (the wiring layer 24).

Specifically, the high-frequency column electrodes 25F are configured in a truncated cone formation.

Moreover, in the semiconductor device 20E of the present embodiment, because of the manufacturing processes, the usual column electrode 25E which does not deal with the high frequency signal is also formed in the same form as the high-frequency column electrode 25F.

As described above, since the semiconductor device 20E of the present embodiment has the small area S2 (diameter L2) of the high-frequency column electrode 25F in the portion which touches the high-frequency electrode pad 45A, it is possible to attain reduction of the parasitic capacitance between the high-frequency column electrode 25F and the semiconductor chip 22, and the transmission characteristic can be improved.

Moreover, since the area S1 (diameter L1) of the high-frequency column electrode 25F in the tip which touches the solder ball 27 can be enlarged, the junction of the high-frequency column electrode 25F and the solder ball 27 can be raised, and the mounting reliability can be raised.

In addition, the tip of each of the column electrodes 25E and 25F projects from the surface of the encapsulation resin 28 similar to the above-mentioned embodiments.

Moreover, the solder ball 27 is arranged in the tip of each of the column electrodes 25E and 25F through the barrier metal 26.

Therefore, the solder ball 27 and the surface of the encapsulation resin 28 are separated from each other, and the same effect as the above-mentioned embodiments can be realized.

Next, a description will be given of the manufacture method of the semiconductor device 20E having the above-mentioned composition.

FIGS. 15A to 15F show the manufacture method of the semiconductor device 20E along with the manufacture procedures.

Figure 15A:
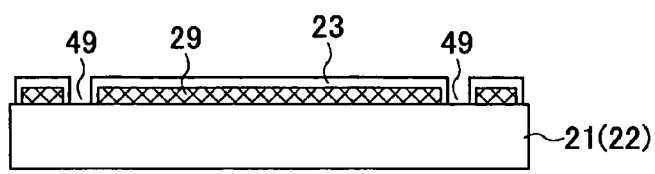
FIG. 15A through FIG. 15F are diagrams for explaining the method of manufacturing the semiconductor device in the fifth preferred embodiment of the invention.

In order to manufacture the semiconductor device 20E, the insulating film 23 is formed on the semiconductor substrate 21 in which the passivation film 29 is formed, and the hole 49 is formed at the position which is opposed to the electrode part currently formed in the semiconductor substrate 21 of the insulating film 23 as shown in FIG. 15A.

Figure 15B:
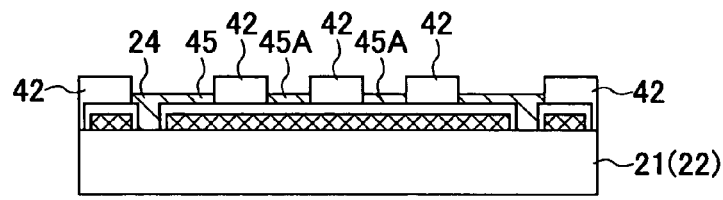

Then, as shown in FIG. 15B, the resist 42 for wiring in which the predetermined pattern is formed is formed in the upper part of the insulating film 23, and the wiring layer 24, the electrode pad 45, and the high-frequency electrode pad 45A are formed using the resist 42 for wiring.

Figure 15C:
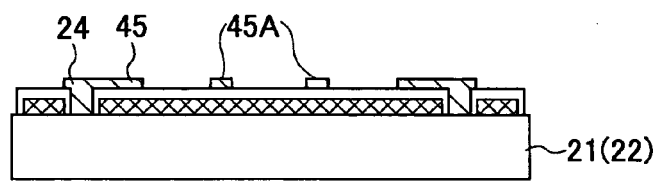

After the end of formation processing of the pads 24, 45, and 45A, the resist 42 for wiring is removed as shown in FIG. 15C.

Next, the resist 43 for the electrodes is formed on the semiconductor substrates 21 in which the pads 24, 45, and 45A are formed. In order to form the resist 43 for the electrodes on the semiconductor substrate 21, the DFR which serves as the resist 43 for the electrodes is arranged on the semiconductor substrate 21. The DFR is the photo-sensitive resin, and arbitrary opening patterns can be formed with the DFR by carrying out the exposure processing etc.

Figure 15D:
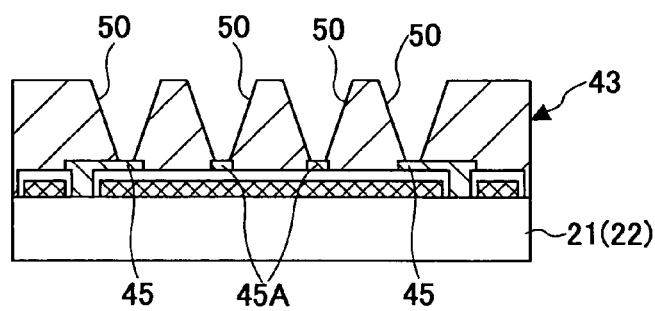
Figure 15E:
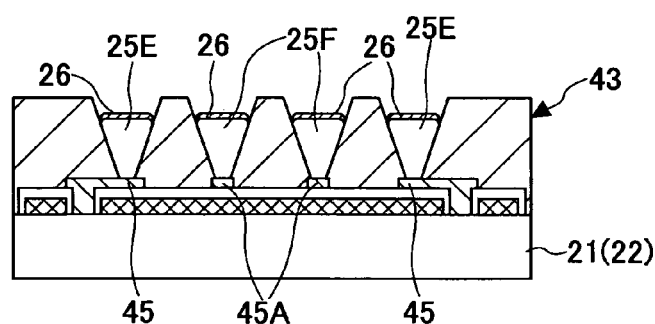

In the present embodiment, the opening pattern 50 of a truncated cone form is formed by optimizing the exposure conditions. FIG. 15D shows the state where the opening pattern 50 of a truncated cone form is formed. The opening is formed in the lower part of each of the opening pattern 50, and therefore the composition is that the electrode pad 45 and the high-frequency electrode pad 45A are exposed to the opening pattern 50.

After the end of the formation of the resist 43 for the electrodes having the opening pattern 50, the processing which forms the high-frequency column electrode 25F and the column electrode 25E in the opening pattern 50 using the resist 43 for the electrodes is performed as shown in FIG. 15D. In addition, after the end of the formation of the column electrodes 25E and 25F, the barrier metal 26 is formed in the tip.

After the resist 43 for the electrodes is removed, the encapsulation resin 28 is formed through the transfer molding.

Figure 15F:
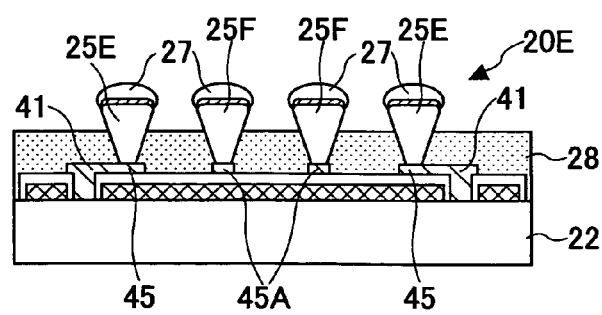

By carrying out the dicing processing, the semiconductor substrate 21 is cut into pieces, and the semiconductor device 20E shown in FIG. 15F is formed.

Moreover, the semiconductor device 20F shown in FIG. 16 is constituted so that the diameter (L3) of the portion which touches the solder ball 27 of the high-frequency column electrode 25H is larger than the diameter (L4) of the portion which touches the high-frequency electrode pad 45A (the wiring layer 24) (L3>L4).

Therefore, the area (S3) of the portion which touches the solder ball 27 of the high-frequency column electrode 25H is larger than the area (S4) of the portion which touches the high-frequency electrode pad 45A (the wiring layer 24) (S3>S4).

In the present embodiment, the high-frequency column electrode 25H is provided so that it has a stepwise increase of the cross-section area thereof in accordance with a distance of the high-frequency column electrode 25H separate from the high-frequency electrode pad 45A (wiring layer 24).

Specifically, the high-frequency column electrode 25H is provided with the large-diameter part 51 located on the side of the solder ball 27, and the small-diameter part 52 located on the side of the high-frequency electrode pad 45A, and therefore it has the composition in which a stepwise increase of the cross-sectional area is provided between the large-diameter part 51 and the small-diameter part 52.

In addition, in the present embodiment, the usual column electrode 25G which is not the high-frequency column electrode also has the same composition as the high-frequency column electrode 25H described above.

Similar to the semiconductor device 20E of the fifth preferred embodiment of FIG. 14, the semiconductor device 20F of the present embodiment has the small area S4 (diameter L4) of the high-frequency column electrode 25H in the portion which touches the high-frequency-electrode-pad 45A. This allows reduction of the parasitic capacitance between the high-frequency column electrode 25H and the semiconductor chip 22, and the transmission characteristic can be improved.

Moreover, since the area S1 (diameter L1) of the high-frequency column electrode 25H in the tip which touches the solder ball 27 is large, the junction of the high-frequency column electrode 25H and the solder ball 27 can be raised, and the mounting reliability can be raised.

In addition, in the semiconductor device 20F of the present embodiment, the tip of each of the column electrodes 25G and 25H projects from the surface of the encapsulation resin 28 similar to the previously described embodiments.

Moreover, the solder ball 27 is arranged in the tip of each of the column electrodes 25G and 25H through the barrier metal 26. Therefore, the solder ball 27 and the surface of the encapsulation resin 28 are separated from each other, and the same effect as the above-mentioned embodiments can be realized.

Next, a description will be given of the manufacture method of the semiconductor device 20F having the above-mentioned composition.

FIGS. 17A to 17G show the manufacture method of the semiconductor device 20F along with the manufacture procedures. In addition, a description of the processing which is the same as in the manufacture method of the semiconductor device 20E of FIG. 15 will be omitted suitably.

Figure 17A:
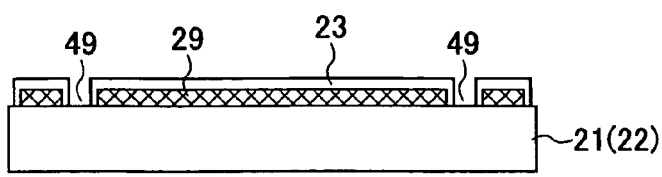
FIG. 17A through FIG. 17G are diagrams for explaining the method of manufacturing the semiconductor device in the sixth preferred embodiment of the invention.
Figure 17B:
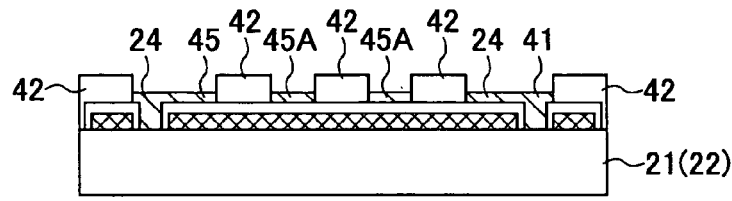
Figure 17C:
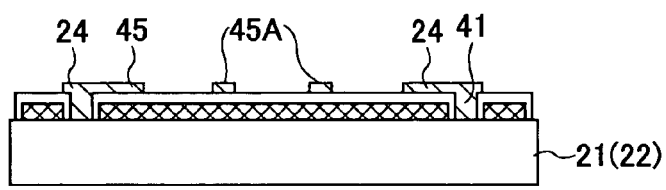

FIGS. 17A to 17C are the same as FIGS. 15A to 15C.

Figure 17D:
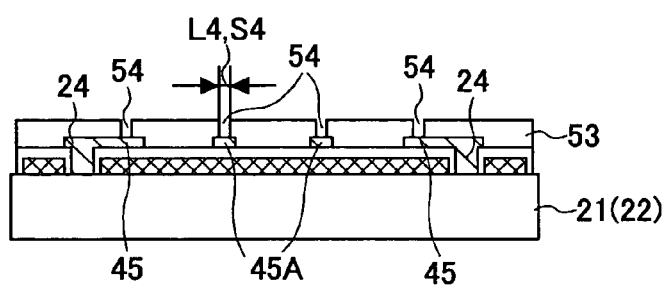

In the present embodiment, after the electrode pads 24, 45, and 45A are formed as shown in FIG. 17C, the second insulating film 53 is formed as shown in FIG. 17D.

The small-diameter opening 54 is formed in the position where the second insulating film 53 is opposed to the electrode pads 45 and 45A.

The diameter and area of the small-diameter opening 54 are the same as the diameter (L4) and area (S4) of the small-diameter part 52 of the high-frequency column electrode 25H. In addition, it is desirable that the material of the second insulating film 53 is the same material as the insulating film 23 for the purpose of internal-stress prevention.

Next, the resist 43 for the electrodes is formed on the semiconductor substrate 21 in which the second insulating film 53 is formed.

In order to form the resist 43 for the electrodes on the semiconductor substrate 21, the photosensitive DFR which serves as the resist 43 for the electrodes is arranged on the semiconductor substrate 21, and the large-diameter opening 55 is formed by carrying out the exposure processing. The diameter and area of the large-diameter opening 55 are the same as the diameter (L3) and area (S3) of the large-diameter part 51 of the high-frequency column electrode 25H.

Figure 17E:
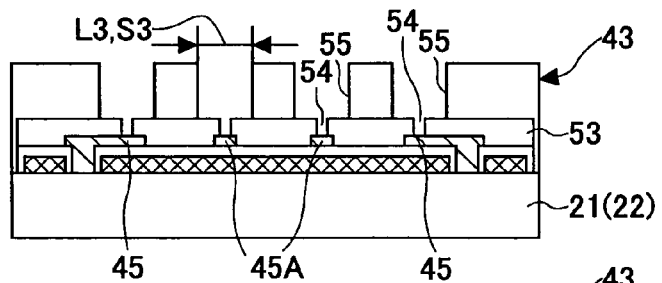

FIG. 17E shows the state where the large-diameter opening 55 is formed. The small-diameter opening 54 formed in the second insulating film 53 is located in the lower part of each large-diameter opening 55. Therefore, the composition is that the electrode pad 45 and the high-frequency-electrode-pad 45A expose through the small-diameter opening 54 and the large-diameter opening 55.

Figure 17F:
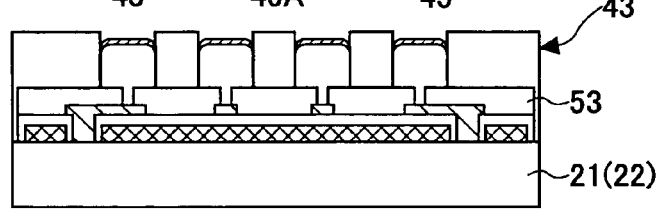

After the resist 43 for the electrodes having the large-diameter opening 55 is formed, the processing which forms the high-frequency column electrode 25H and the column electrode 25G in the large-diameter opening 55 and the small-diameter opening 54 is performed using the resist 43 for the electrodes as shown in FIG. 17F.

In addition, after the formation of the column electrodes 25G and 25H, the barrier metal 26 is formed in the tip.

After the resist 43 for the electrodes is removed, the encapsulation resin 28 is formed through the transfer molding.

Figure 17G:
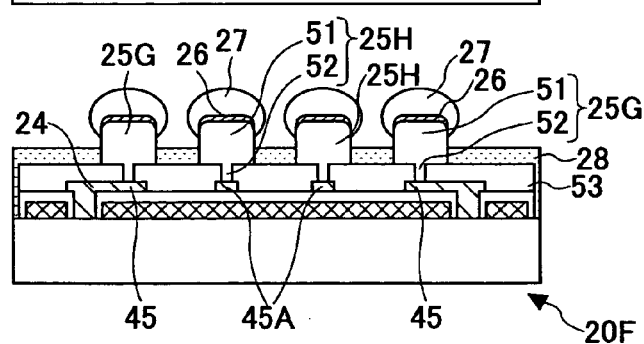

Next, by carrying out the dicing processing, the semiconductor substrate 21 is cut into pieces, and the semiconductor device 20F shown in FIG. 17G is formed.

The present invention is not limited to the above-described embodiments, and variations and modifications may be made without departing from the scope of the present invention.

What is claimed is:

1. A semiconductor device, comprising:
   a semiconductor chip;
   a wiring layer formed on the semiconductor chip;
   a column electrode connected at a first end to the wiring layer; and
   an encapsulation resin formed on the semiconductor chip;
   wherein the column electrode is provided with a second end, opposite to the first end, projecting from the encapsulation resin, and an external connection member is connected to the column electrode at the second end so that the external connection member is separate from a surface of the encapsulation resin by a clearance between the encapsulation resin and the external connection member,
   wherein a cross-sectional area of the column electrode in contact at the second end with the external connection member is large than a cross-sectional area of the column electrode in contact at the first end with the wiring layer.

2. The semiconductor device according to claim 1 wherein said clearance between the encapsulation resin surface and the external connection member is above 10 micrometers and below 80 micrometers.

3. The semiconductor device according to claim 1 wherein a barrier metal is provided between the column electrode and the external connection member.

4. The semiconductor device according to claim 1 wherein the cross-sectional area of the column electrode increases continuously from at the first end to at the second end according to a distance from the wiring layer.

5. The semiconductor device according to claim 1 wherein the cross-sectional area of the column electrode has a stepwise increase from at the first end to at the second end according to a distance from the wiring layer.

6. A semiconductor device, comprising:
a semiconductor chip;
wiring layer formed on the semiconductor chip;
a column electrode connected at a first end to the wiring layer; and
an encapsulation resin formed on the semiconductor chip;
wherein the column electrode is provided with a second end, opposite to the first end, projecting from the encapsulation resin, and an external connection member is connected to the column electrode at the second end so that the external connection member is separated from a surface of the encapsulation resin by a clearance between the encapsulation resin and the external connection member,
wherein a diameter of the second end of the column electrode separate from the surface of the encapsulation resin is larger than a diameter of the first end of the column electrode in contact with the wiring layer.

7. The semiconductor device according to claim 6 wherein the diameter of the column electrode increases continuously from at the first end according to a distance from the wiring layer.

8. The semiconductor device according to claim 6 wherein the diameter of the column electrode has a stepwise increase from at the first end to at the second end according to a distance from the wiring layer.

9. The semiconductor device according to claim 6 wherein said clearance between the encapsulation resin surface and the external connection member is above 10 micrometers and below 80 micrometers.

10. The semiconductor device according to claim 6 wherein a barrier metal is provided between the column electrode and the external connection member.

* * * * *